United States Patent
Wang

(10) Patent No.: US 8,291,583 B2
(45) Date of Patent: *Oct. 23, 2012

(54) PACKAGING METHOD FOR ASSEMBLING CAPTIVE SCREW TO PRINTED CIRCUIT BOARD

(76) Inventor: Ting-Jui Wang, Sindian (TW)

( * ) Notice: Subject to any disclaimer, the term of this patent is extended or adjusted under 35 U.S.C. 154(b) by 422 days.

This patent is subject to a terminal disclaimer.

(21) Appl. No.: 12/574,719

(22) Filed: Oct. 7, 2009

(65) Prior Publication Data

US 2010/0088886 A1    Apr. 15, 2010

(30) Foreign Application Priority Data

Oct. 9, 2008   (TW) .............................. 97139033 A

(51) Int. Cl.
*H05K 3/34*    (2006.01)
(52) U.S. Cl. ................. 29/840; 29/830; 29/832; 29/846; 29/848; 29/856
(58) Field of Classification Search .............. 29/840, 29/825, 842, 843, 525.1, 830, 831, 832, 846, 29/848, 856, 857, 883, 860; 411/353, 258, 411/552, 191, 926, 999; 361/803, 782, 784, 361/795
See application file for complete search history.

(56) References Cited

U.S. PATENT DOCUMENTS

| | | | |
|---|---|---|---|
| 5,382,124 A * | 1/1995 | Frattarola | 411/352 |
| 6,238,155 B1 * | 5/2001 | Aukzemas et al. | 411/107 |
| 6,761,521 B2 * | 7/2004 | McCormack et al. | 411/353 |
| 7,703,200 B2 * | 4/2010 | Wang et al. | 29/843 |

* cited by examiner

*Primary Examiner* — Derris Banks
*Assistant Examiner* — Tai Nguyen
(74) *Attorney, Agent, or Firm* — Schmeiser, Olsen & Watts, LLP

(57) ABSTRACT

A packaging method for assembling a captive screw to a printed circuit board (PCB) includes the steps of providing a captive screw having a screw head, a threaded shank and a sleeve; pressing a fixture toward the screw head for a part of the threaded shank to exposed from a distal end of the sleeve, and then clamping the fixture on the sleeve; providing a PCB having through holes and a layer of solder provided thereon; using a tool to pick up the fixture and the captive screw and align the threaded shank with one through hole on the PCB; releasing the fixture and the captive screw from the tool for a flange at the distal end of the sleeve to extend into the through hole; heating, melting and then cooling to harden the solder layer, so that the sleeve is fixedly held to the PCB; and removing the fixture.

5 Claims, 10 Drawing Sheets providing a captive screw, which includes a screw head, a threaded shank downward extended from a lower end of the screw head, and a sleeve fitted around and movable along the threaded shank; (1)

pressing a fixture against the screw head, and then, clamping the fixture on an outer surface of the sleeve; (2)

providing a printed circuit board (PCB) having a plurality of through holes formed thereon, and applying a layer of solder on a top of the PCB; (3)

bringing a tool to contact with the fixture so as to pick up the captive screw, and then moving the tool to align the exposed threaded shank with one of the through holes on the PCB; (4)

releasing the tool from the fixture and the captive screw and allowing the fixture and the captive screw to fall, so that a flange axially extended from the second end of the sleeve is extended into the through hole; (5)

heating and melting the layer of solder and then allowing the molten solder layer to cool down to room temperature and become hardened again, so that the second end of the sleeve is fixedly held to the PCB with the flange firmly fitted in the through hole; and (6)

removing the fixture from the sleeve and the screw head (7)

FIG. 6

PACKAGING METHOD FOR ASSEMBLING CAPTIVE SCREW TO PRINTED CIRCUIT BOARD

CROSS-REFERENCE TO RELATED APPLICATIONS

This non-provisional application claims priority under 35 U.S.C. §119(a) on Patent Application No(s). 097139033 filed in Taiwan, R.O.C. on 9 Oct., 2008, the entire contents of which are hereby incorporated by reference.

FIELD OF THE INVENTION

The present invention relates to a packaging method for assembling a captive screw to a printed circuit board (PCB), and more particularly to a packaging method that enables a captive screw to be easily and accurately assembled to a PCB without deviation and skew.

BACKGROUND OF THE INVENTION

FIG. 1 shows a conventional captive screw 5 for using with a printed circuit board (PCB). The captive screw 5 includes a screw head 51, a threaded shank 52, and a sleeve 53 having a free end with an axially extended toothed flange 531. The sleeve 53 normally encloses the threaded shank 52 and is retractable into the screw head 51 under pressure to expose the threaded shank 52, as shown in FIG. 2. To assemble the captive screw 5 to a PCB 7, first align the sleeve 53 with a through hole 71 provided on the PCB 7, as shown in FIG. 3. Then, apply a downward force on the screw head 51, so that the toothed flange 531 of the sleeve 53 is pressed into the through hole 71, as shown in FIG. 4. And, keep applying the downward force until the toothed flange 531 is completely fitted in the through hole 71 to connect the captive screw 5 to the PCB 7.

The above conventional manner of assembling the captive screw 5 to the PCB 7 has some disadvantages: (a) The sleeve 53 is directly aligned with the through hole 71. However, since the screw head 51 and the sleeve 53 could not be held together through compression, the captive screw 5 must be manually positioned above and aligned with the through hole 71. (b) Since the captive screw 5 is very small in volume and the through hole 71 has a relatively small diameter, the manual position of the captive screw 5 above the through hole 71 is subject to error, preventing the flange 531 of the sleeve 53 from being easily and accurately aligned with the through hole 71 and resulting in a poorly assembled or even a damaged PCB 7. (c) In the event the flange 531 of the sleeve 53 is not pressed into the through hole 71 in one single operation, the flange 531 tends to be incompletely fitted in the through holes 71 and becomes deviated or skewed due to inaccurate planeness of the PCB 7. (d) To assemble the captive screw 5 to the PCB 7 by pressing the toothed flanges 531 of the sleeves 53 into the through holes 71, the captive screw 5 is individually picked up and moved to the PCB 7. Therefore, the assembly of a large amount of captive screws 5 to the PCB 7 could not be efficiently carried out using the surface mount technology (SMT) that has been widely employed in the electronic industrial field.

SUMMARY OF THE INVENTION

A primary object of the present invention is to provide a packaging method for assembling a captive screw to a PCB, so that the captive screw can be easily and accurately assembled to the PCB with a sleeve of the captive screw firmly fitted in a through hole on the PCB without the risk of becoming deviated or skewed in position.

To achieve the above and other objects, the packaging method for assembling a captive screw to a PCB according to a preferred embodiment of the present invention includes the following steps:

(1) providing a captive screw, which includes a screw head, a threaded shank downward extended from a lower end of the screw head, and a sleeve fitted around and movable along the threaded shank;

(2) pressing a fixture against the screw head, and then, clamping the fixture on an outer surface of the sleeve;

(3) providing a printed circuit board (PCB) having a plurality of through holes formed thereon, and applying a layer of solder on a top of the PCB;

(4) bringing a tool to contact with the fixture so as to pick up the captive screw, and then moving the tool to align the exposed threaded shank with one of the through holes on the PCB;

(5) releasing the tool from the fixture and the captive screw and allowing the fixture and the captive screw to fall, so that a flange axially extended from the second end of the sleeve is extended into the through hole;

(6) heating and melting the layer of solder and then allowing the molten solder layer to cool down to room temperature and become hardened again, so that the second end of the sleeve is fixedly held to the PCB with the flange firmly fitted in the through hole; and (7) removing the fixture from the sleeve and the screw head.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 6 is a flowchart showing the steps included in a packaging method for assembling a captive screw to a PCB according to a preferred embodiment of the present invention;

DETAILED DESCRIPTION OF THE PREFERRED EMBODIMENTS

Please refer to FIG. 6 that is a flowchart showing the steps included in a packaging method for assembling a captive screw to a printed circuit board (PCB) according to a preferred embodiment of the present invention.

Figure 1:
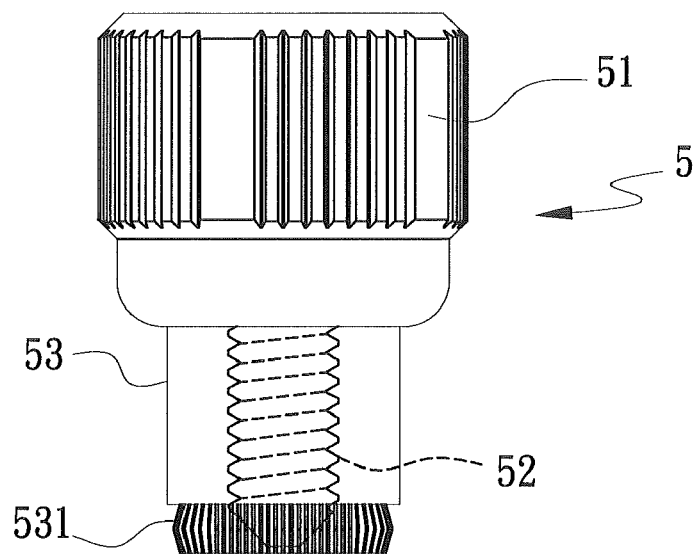
FIG. 1 shows a conventional captive screw with a sleeve thereof extended from a screw head of the captive screw.
Figure 2:
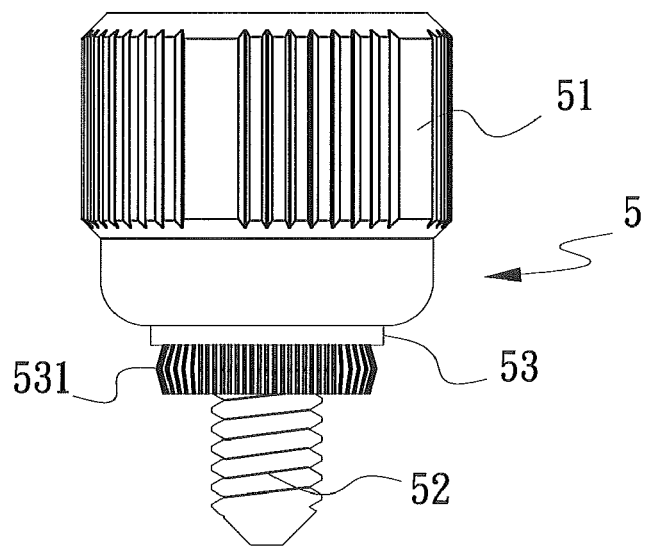
FIG. 2 shows the captive screw of FIG. 1 with the sleeve retracted into the screw head to expose a threaded shank of the captive screw.
Figure 3:
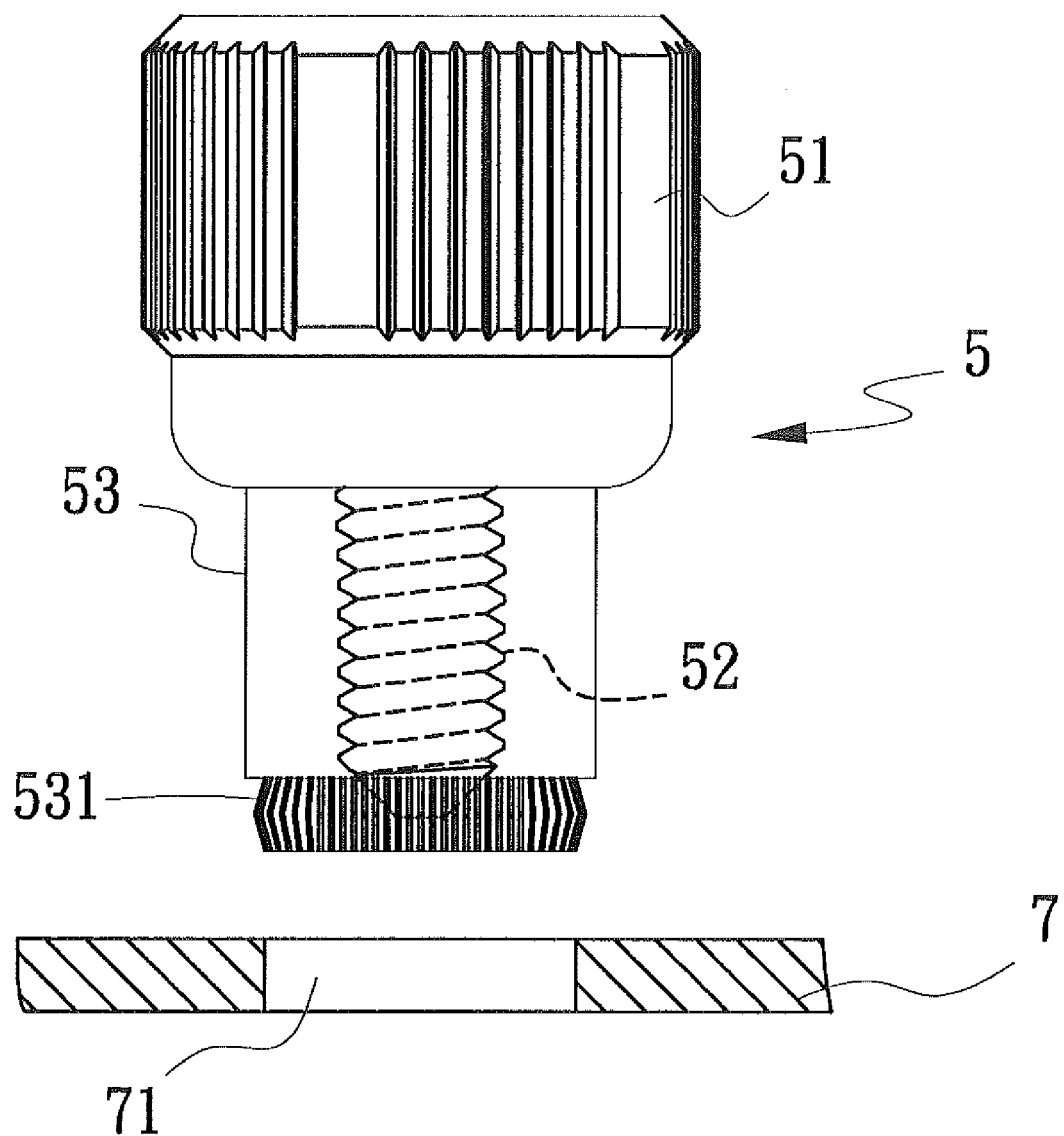
FIGS. 3 to 5 show the steps of assembling the captive screw of FIG. 1 to a PCB according to a conventional packaging method.
Figure 4:
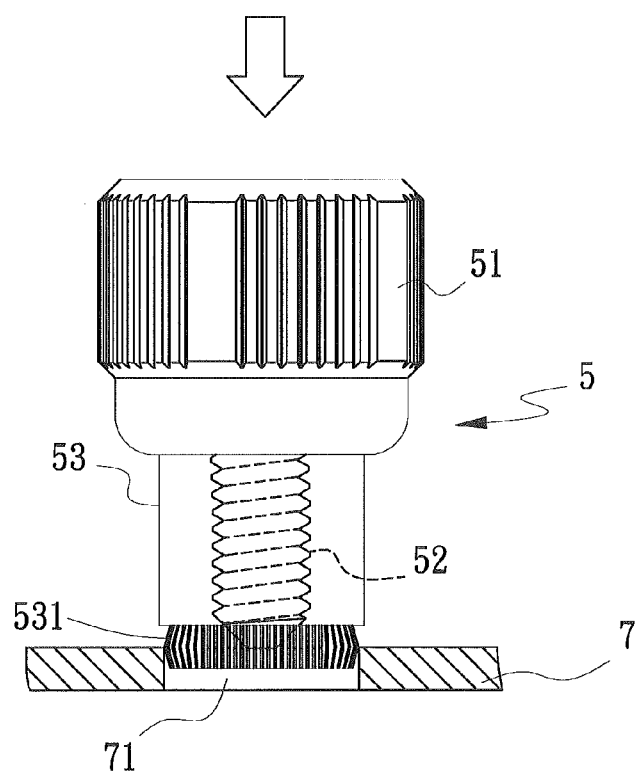
Figure 5:
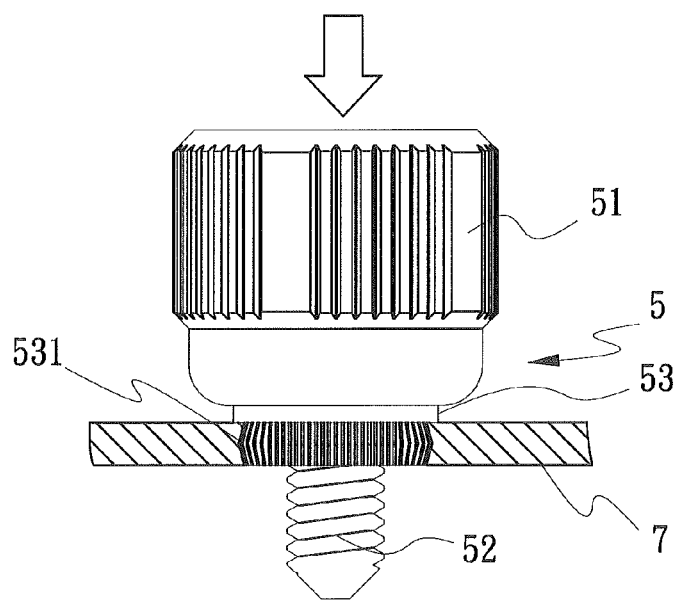
Figure 7:
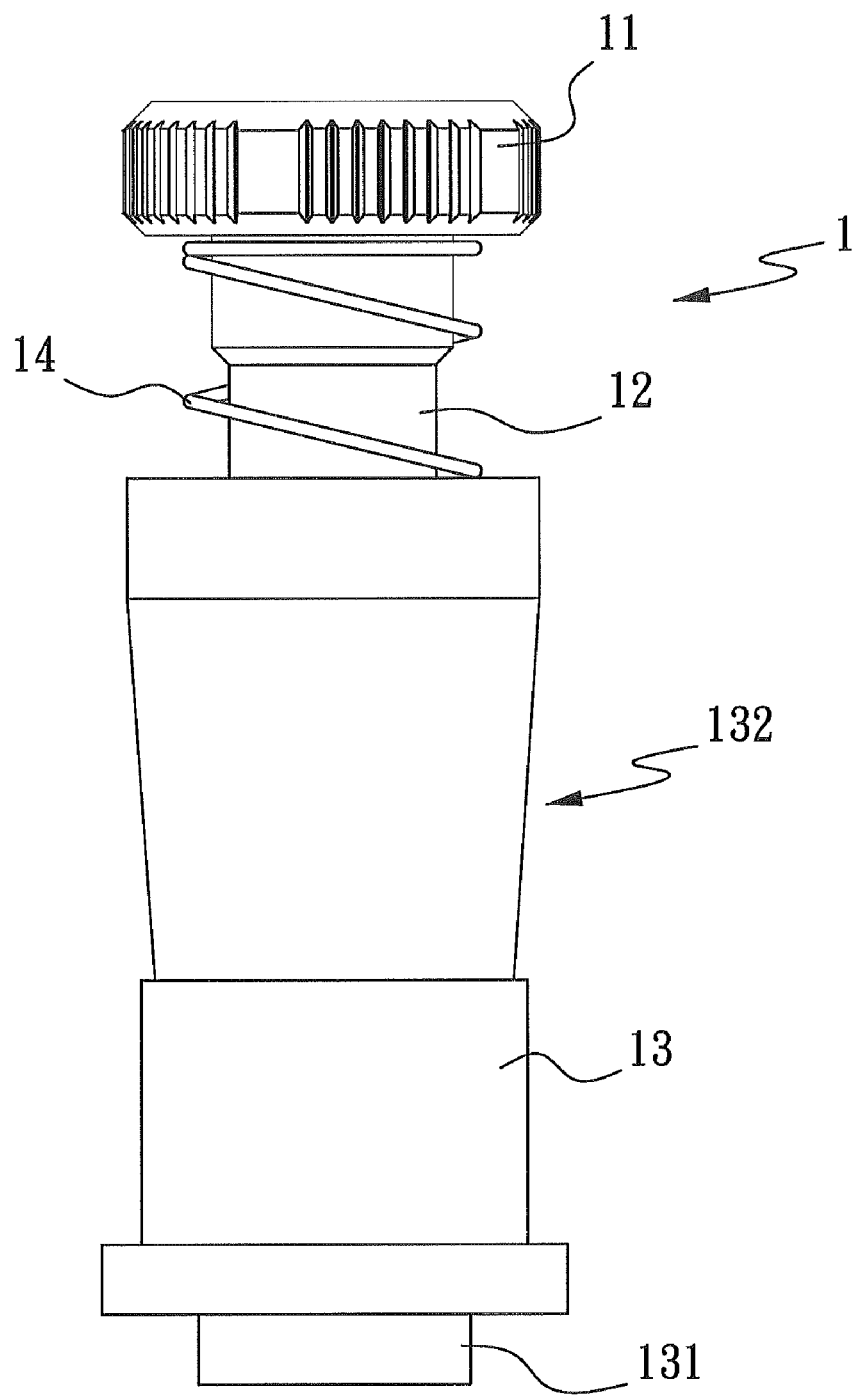
FIG. 7 shows a captive screw based on which the packaging method of the present invention is implemented.

In step (1), a captive screw 1 is provided. As shown in FIG. 7, the captive screw 1 includes a screw head 11, a threaded shank 12 downward extended from a lower end of the screw head 11, a sleeve 13 fitted around and elastically movable along the threaded shank 12, and a spring 14 having an end pressed against the lower end of the screw head 11 and another opposing end set in and pressed against the sleeve 13. With the spring 14, the sleeve 13 is elastically movable along the threaded shank 12.

Figure 8:
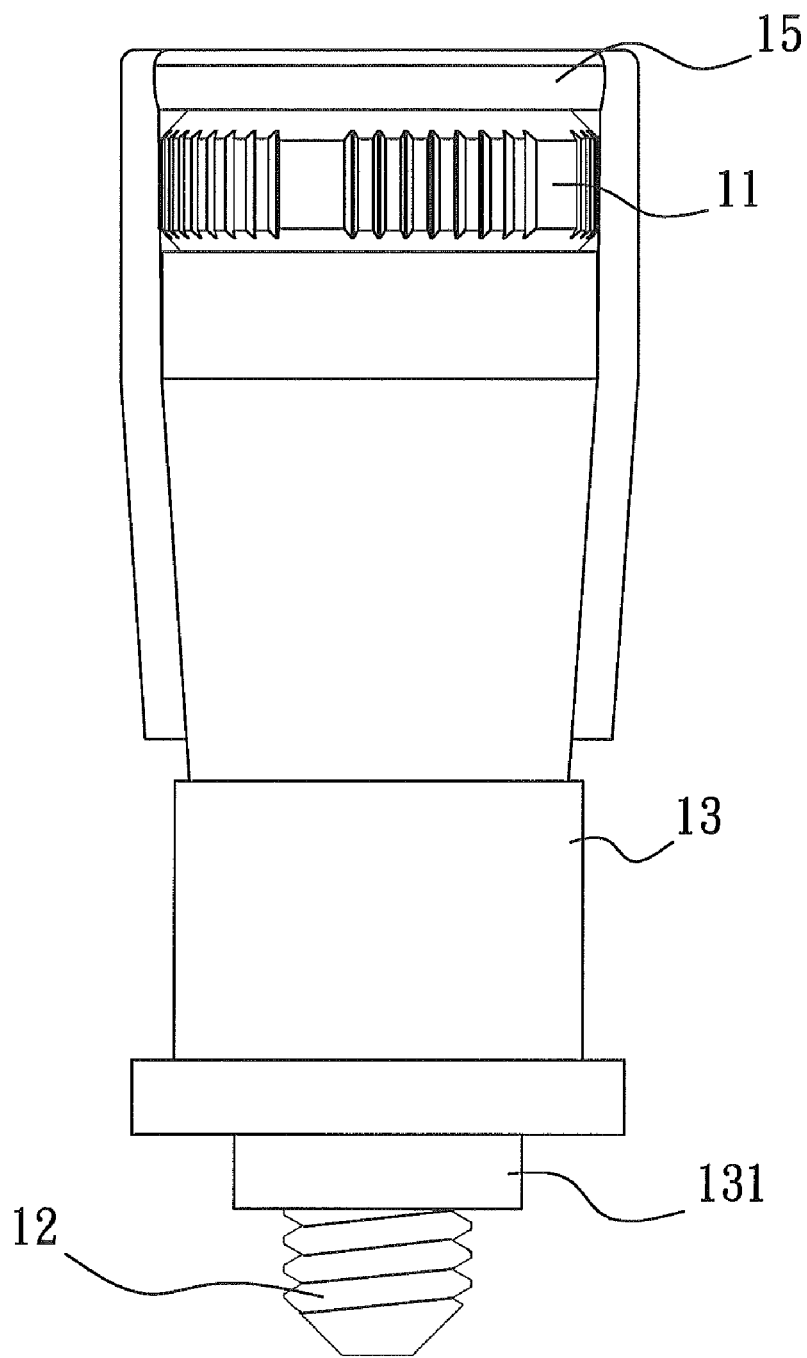
FIG. 8 shows a fixture is clamped onto a sleeve of the captive screw to expose a threaded shank from the sleeve.

In step (2), as shown in FIG. 8, a fixture 15 is pressed against the screw head 11, and then, the fixture 15 is clamped on an outer surface of the sleeve 13. When the fixture 15 is pressed against the screw head 11, the screw head 11 is toward a first end of the sleeve 13, so that a part of the threaded shank 12 is exposed from an opposing second end of the sleeve 13, and then, clamping the fixture 15 on the outer surface of the sleeve 13. The sleeve 13 is provided on and around the outer surface with a recess 132. The fixture 15 is clamped on the sleeve 13 at the recess 132, so as to firmly hold the screw head 11 to the first end of the sleeve 13 for the threaded shank 12 to expose from the second end of the sleeve 13.

Figure 9:
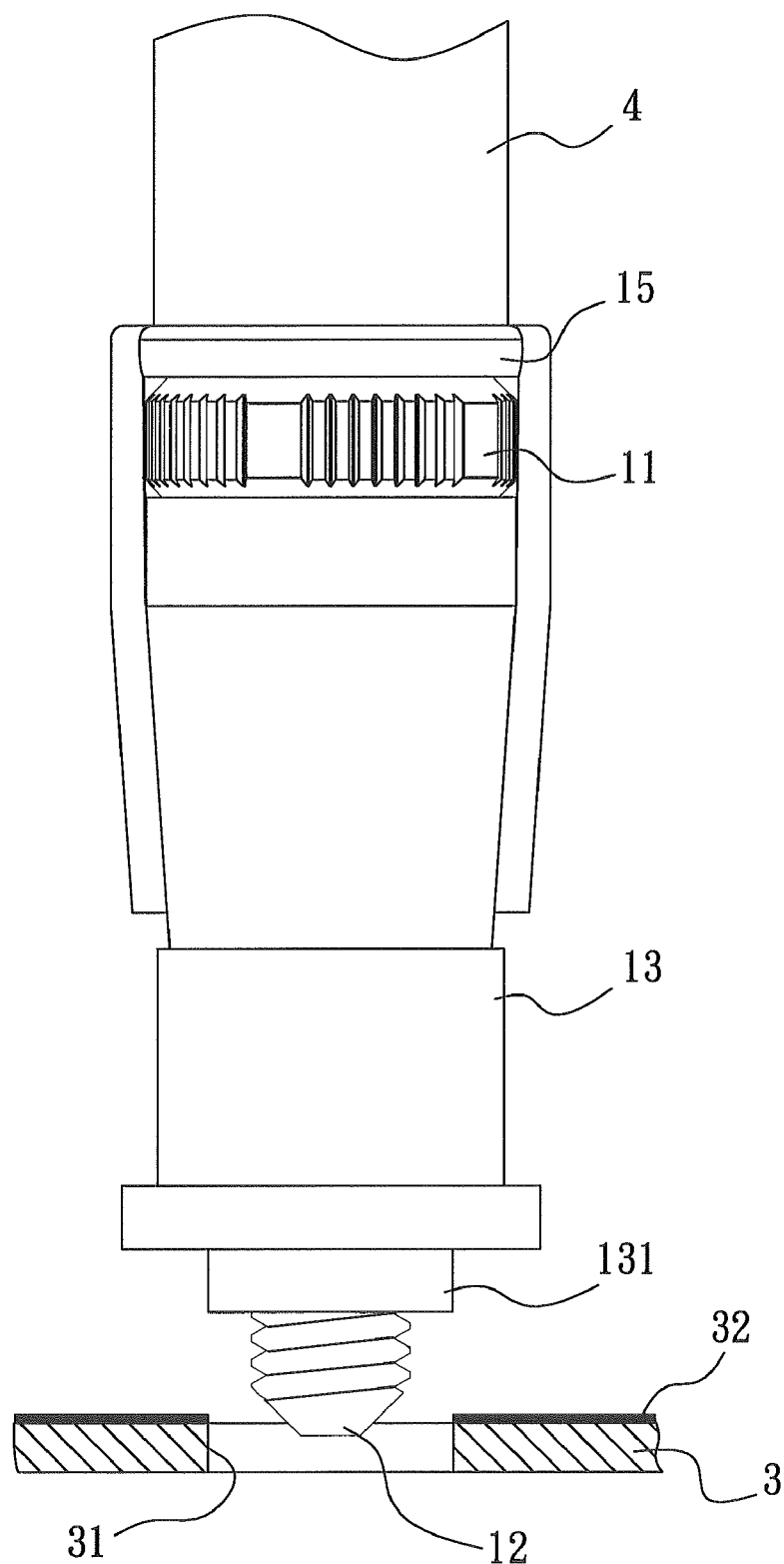
FIG. 9 shows the exposed threaded shank of the captive screw is aligned with a through hole on a PCB using a tool.

In the step (3), as shown in FIG. 9, a printed circuit board (PCB) 3 having a plurality of through holes 31 is provided, and a layer of solder 32 is applied on a top of the PCB 3.

In step (4), also as shown in FIG. 9, a tool 4 is used to contact with the fixture 15 so as to pick up the captive screw 1. Then, the tool 4 is moved to align the threaded shank 12 of the captive screw 1 with one of the through holes 31 on the PCB 3 while a distance about 0.4 mm is left between the second end of the sleeve 13 of the captive screw 1 and the through hole 31. The tool 4 may be a vacuum sucking device.

Figure 10:
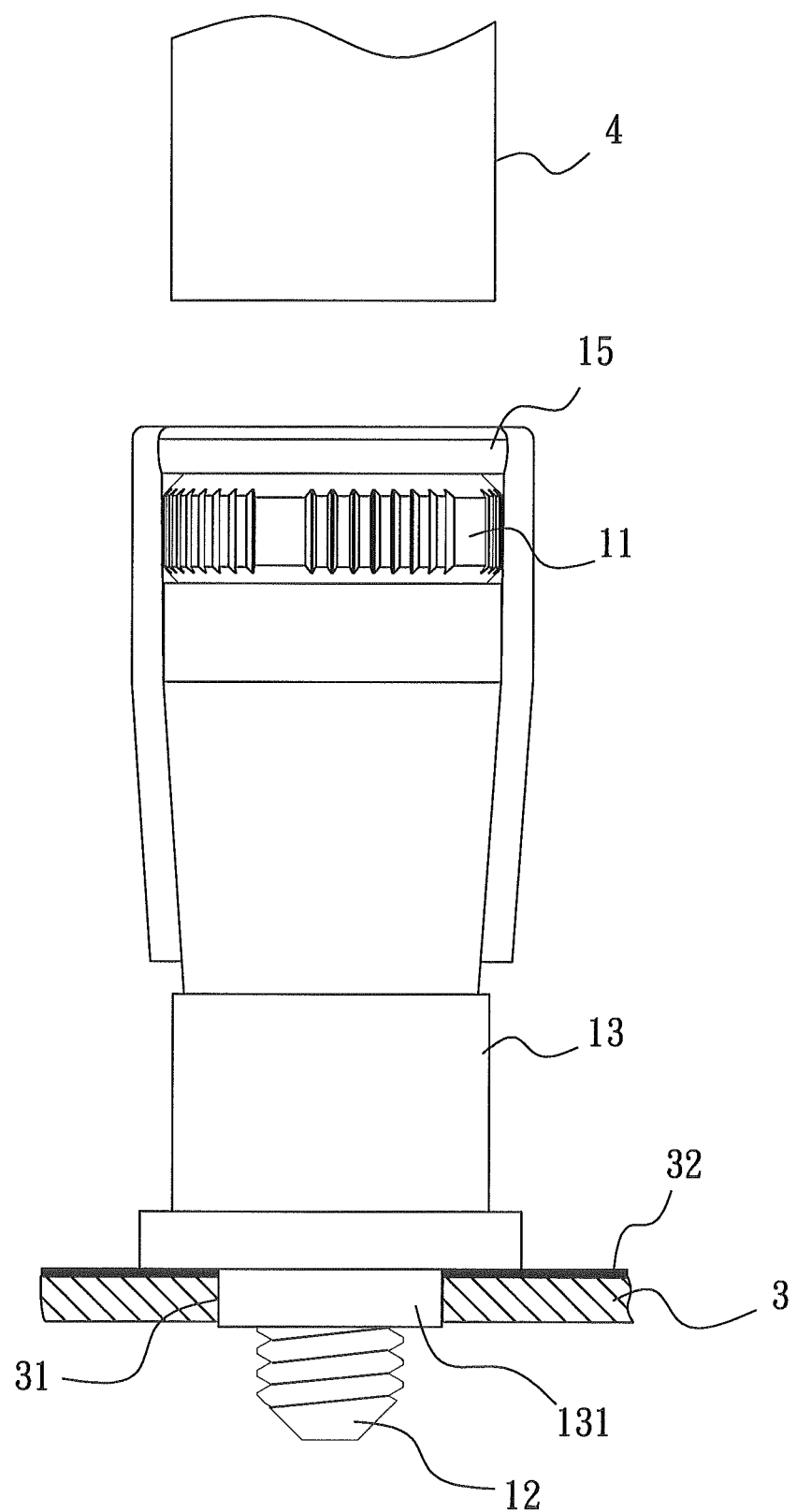
FIG. 10 shows the captive screw is released from the tool.

In step (5), as shown in FIG. 10, the fixture 15 and the captive screw 1 are released from the tool 4 and allowed to fall, so that a flange 131 axially extended from the second end of the sleeve 13 is extended into the through hole 31.

Figure 11:
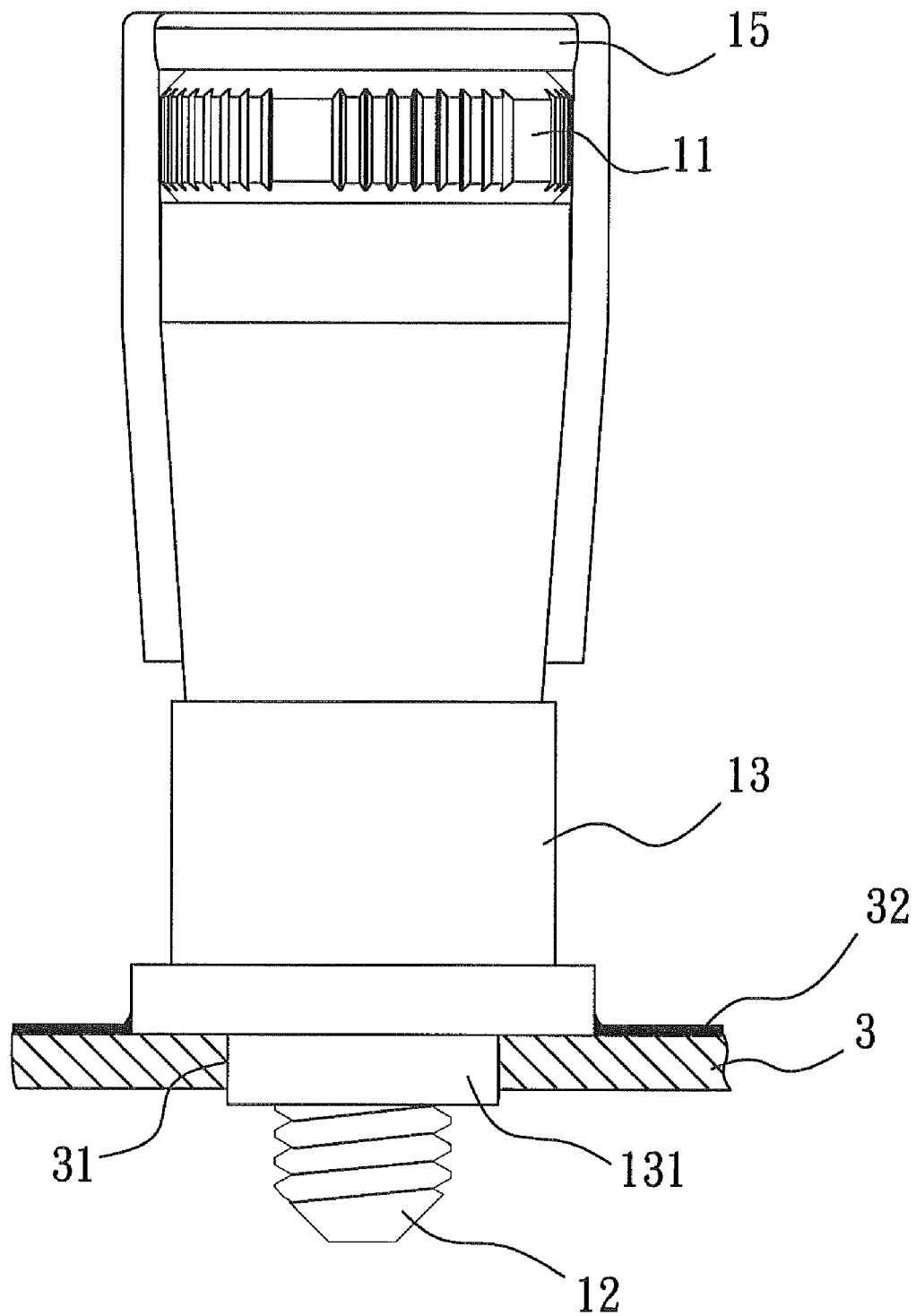
FIG. 11 shows a flange axially extended from the sleeve of the captive screw is firmly fitted in the through hole on the PCB.

In step (6), as shown in FIG. 11, the layer of solder 32 is heated to melt and then allowed to cool down to room temperature and become hardened again, so as to fixedly hold the second end of the sleeve 13 to the PCB 3 with the flange 131 firmly fitted in the through hole 31.

Figure 12:
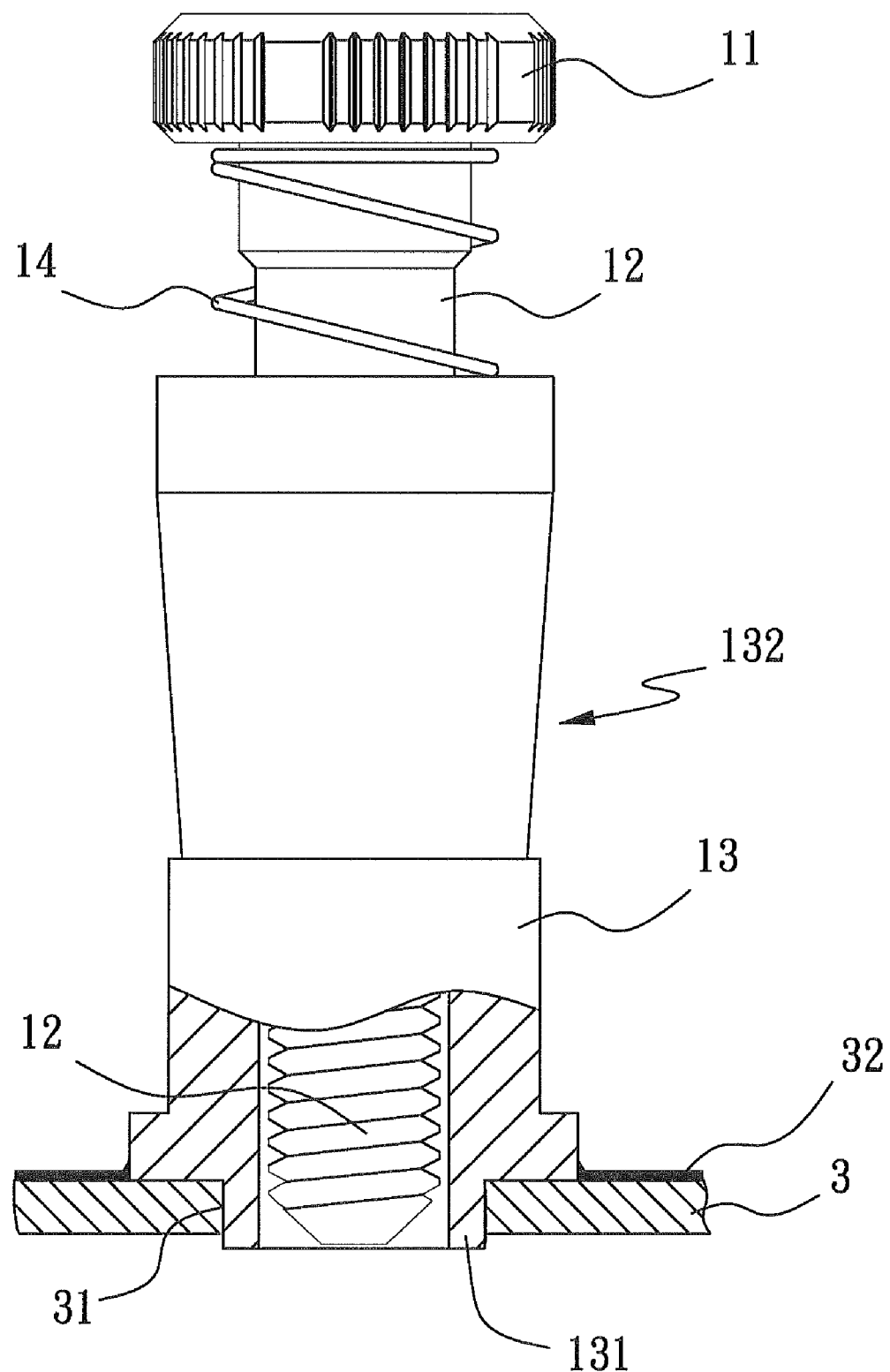
FIG. 12 shows the fixture is removed from the sleeve and the screw head is sprung upward to retract the threaded shank into the sleeve.

In step (7), as shown in FIG. 12, the fixture 15 is removed from the sleeve 13 and the screw head 11. At this point, the screw head 11 is automatically sprung upward by the spring 14, bringing the threaded shank 12 to retract into the sleeve 13 that has already been fixedly held to the PCB 3.

Briefly speaking, when using the packaging method of the present invention to assemble the captive screw 1 to the PCB 3, first use the fixture 15 to press the screw head 11 toward the first end of the sleeve 13 to expose a part of the threaded shank 12 from the second end of the sleeve 13, allowing the captive screw 1 to be packaged to a uniform packaging level on the PCB 3 and the flange 131 at the second end of the sleeve 13 to be accurately extended into the through hole 31 on the PCB 3 without deviation and skew.

With the packaging method of the present invention, the flange of the sleeve of the captive screw can be easily and accurately held in the through hole on the PCB without deviation and skew to thereby enable correct assembly of the captive screw to the PCB. Therefore, the present invention effectively overcomes the problems in the conventional manner of mounting a captive screw on a PCB.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A packaging method for assembling a captive screw to a printed circuit board (PCB), comprising the steps of:
   (1) providing a captive screw, which includes a screw head, a threaded shank downward extended from a lower end of the screw head, and a sleeve fitted around and movable along the threaded shank;
   (2) pressing a fixture against the screw head, and then, clamping the fixture on an outer surface of the sleeve;
   (3) providing a printed circuit board (PCB) having a plurality of through holes formed thereon, and applying a layer of solder on a top of the PCB;
   (4) bringing a tool to contact with the fixture so as to pick up the captive screw, and then moving the tool to align the exposed threaded shank with one of the through holes on the PCB;
   (5) releasing the tool from the fixture and the captive screw and allowing the fixture and the captive screw to fall, so that a flange axially extended from the second end of the sleeve is extended into the through hole;
   (6) heating and melting the layer of solder and then allowing the molten solder layer to cool down to room temperature and become hardened again, so that the second end of the sleeve is fixedly held to the PCB with the flange firmly fitted in the through hole; and
   (7) removing the fixture from the sleeve and the screw head.

2. The packaging method for assembling a captive screw to a PCB as claimed in claim 1, wherein the step (2) pressing the fixture against the screw head to let the screw head toward a first end of the sleeve, so that a part of the threaded shank is exposed from an opposing second end of the sleeve, and then, clamping the fixture on the outer surface of the sleeve.

3. The packaging method for assembling a captive screw to a PCB as claimed in claim 1, wherein the captive screw further includes a spring; and the spring having an end pressed against the lower end of the screw head and another opposing end set in and pressed against the sleeve.

4. The packaging method for assembling a captive screw to a PCB as claimed in claim 1, wherein the sleeve is provided on and around an outer surface with a recess, and the fixture being clamped on the sleeve at the recess.

5. The packaging method for assembling a captive screw to a PCB as claimed in claim 1, wherein the tool is a vacuum sucking device.

\* \* \* \* \*